United States Patent
Khullar et al.

[11] Patent Number: 6,097,251
[45] Date of Patent: Aug. 1, 2000

[54] PRE-RECORDED SIGMA DELTA VALUES FOR POWER AMPLIFIER CONTROL

[75] Inventors: Anders Khullar, Bjärred; Lars Gunnar Torbjörn Grahm; Karl Håkan Torbjörn Gärdenfors, both of Malmö; Sven Hans Sebastian Sedvallson, Lund, all of Sweden

[73] Assignee: Telefonaktiebolaget LM Ericsson, Stockholm, Sweden

[21] Appl. No.: 09/086,565

[22] Filed: May 29, 1998

[51] Int. Cl.[7] ........................................... H03G 3/20
[52] U.S. Cl. .................................. 330/129; 455/126
[58] Field of Search ............................. 330/129, 138, 330/279; 455/126, 127; 375/247; 341/144

[56] References Cited

U.S. PATENT DOCUMENTS

| | | | |
|---|---|---|---|
| 4,270,027 | 5/1981 | Agrawal et al. | 179/81 R |
| 4,992,753 | 2/1991 | Jenson et al. | 330/129 |
| 5,057,840 | 10/1991 | Ledzius et al. | 341/144 |
| 5,079,551 | 1/1992 | Kimura et al. | 341/143 |
| 5,117,234 | 5/1992 | Shizawa | 341/143 |
| 5,159,283 | 10/1992 | Jensen | 330/129 |
| 5,225,835 | 7/1993 | Majima et al. | 341/143 |
| 5,245,297 | 9/1993 | Claydon et al. | 330/129 |
| 5,245,345 | 9/1993 | Kohdaka et al. | 341/152 |
| 5,302,913 | 4/1994 | Hori | 330/129 |
| 5,323,157 | 6/1994 | Ledzius et al. | 341/143 |
| 5,349,353 | 9/1994 | Zrilic | 341/144 |
| 5,369,789 | 11/1994 | Kosugi et al. | 455/126 |
| 5,396,244 | 3/1995 | Engel | 341/143 |
| 5,416,441 | 5/1995 | Nagano | 330/129 |
| 5,489,903 | 2/1996 | Wilson et al. | 341/144 |
| 5,504,457 | 4/1996 | Jensen | 330/129 |
| 5,524,285 | 6/1996 | Wray et al. | 455/126 |
| 5,541,600 | 7/1996 | Blumenkrantz et al. | 341/139 |
| 5,565,930 | 10/1996 | Bolger et al. | 348/572 |
| 5,592,165 | 1/1997 | Jackson et al. | 341/144 |
| 5,621,172 | 4/1997 | Wilson et al. | 73/579 |
| 5,621,407 | 4/1997 | Jeong et al. | 341/143 |
| 5,701,106 | 12/1997 | Pikkarainnen et al. | 332/100 |
| 5,712,635 | 1/1998 | Wilson et al. | 341/144 |
| 5,748,126 | 5/1998 | Ma et al. | 341/144 |
| 5,754,591 | 5/1998 | Samueli et al. | 375/235 |
| 5,856,799 | 6/1999 | Hamasaki et al. | 341/144 |

FOREIGN PATENT DOCUMENTS 2 281 461  3/1995  United Kingdom .

*Primary Examiner*—Robert Pascal
*Assistant Examiner*—Khanh V. Nguyen
*Attorney, Agent, or Firm*—Burns, Doane, Swecker & Mathis, L.L.P.

[57] ABSTRACT

In order to increase the resolution of signals input to a power amplifier, this system includes a power control circuit which utilizes sigma delta modulated values which are stored in a memory device. These values, after retrieval from an addressable memory, are supplied only to a low pass filter before being sent to the control input of the power amplifier. The use of sigma delta modulated values can result in a reduction of hardware within the power control circuit of communication devices and increase the signal resolution by moving noise elements from the signal.

14 Claims, 4 Drawing Sheets

PRE-RECORDED SIGMA DELTA VALUES FOR POWER AMPLIFIER CONTROL

BACKGROUND

The present invention generally relates to radiocommunication systems and, more specifically, to an apparatus and associated method for efficiently controlling power amplifiers within radio transmitters in cellular systems.

The cellular telephone industry has made phenomenal strides in commercial operations in the United States as well as the rest of the world. Growth in major metropolitan areas has far exceeded expectations and is outstripping system capacity. If this trend continues, the effects of rapid growth will soon reach even the smallest markets. Innovative solutions are required to meet these increasing capacity needs as well as to maintain high quality service and avoid rising prices.

Throughout the world, one important step in cellular systems is to change from analog to digital transmissions. Equally important is the choice of an effective digital transmission scheme for implementing the next generation of cellular technology. Furthermore, it is widely believed that the first generation of personal communication networks (PCN) (employing low cost, pocket-sized, cordless telephones that can be carried comfortably and used to make and receive calls in the home, office, street, car, etc.), would be provided by the cellular carriers using the next generation digital cellular system infrastructure and the cellular frequencies. The key feature demanded in these new systems is increased traffic capacity.

Currently, channel access is most commonly achieved using frequency division multiple access (FDMA) and time division multiple access (TDMA) methods. In FDMA, a communication channel is a single radio frequency band into which a signal's transmission power is concentrated. Interference with adjacent channels is limited by the use of bandpass filters which only pass signal energy within the specified frequency band. Thus, with each channel being assigned a different frequency, system capacity is limited by the available frequencies as well as by limitations imposed by channel radios.

In TDMA systems, a channel consists of a time slot in a periodic train of time intervals over the same frequency. Each period of time slots is called a frame. A given signal's energy is confined to one of these time slots. Adjacent channel interference is limited by the use of a time gate or other synchronization element that only passes signal energy received at the proper time. Thus, the portion of the interference from different relative signal strength levels is reduced.

Capacity in a TDMA system is increased by compressing the transmission signal into a shorter time slot. As a result, the information must be transmitted at a correspondingly faster bit rate which increases the amount of occupied spectrum proportionally.

With FDMA or TDMA systems, or a hybrid FDMA/TDMA system, it is desirable to avoid the case where two potentially interfering signals occupy the same frequency at the same time. In contrast, code division multiple access (CDMA) allows signals to overlap in both time and frequency. Thus, all CDMA signals share the same frequency spectrum. In either the frequency or the time domain, the multiple access signals appear to be on top of each other.

For all such systems, but especially CDMA systems, power control is an important technique for balancing the desire to provide an end user with a sufficiently strong signal while at the same time not causing too much interference to other users. Various types of power control techniques exist, but many involve being able to adjust the power at which a signal is being transmitted by predefined increments.

Power amplifiers (PAs) are widely utilized in radio transmitters in order to generate amplified signals to be transmitted. The aforedescribed power control techniques may control a transmitter's power amplifier to amplify RF signals at one of several distinct power levels. The more accurate the PA in the amplification of these signals, the more efficient the transmitter operation.

In order for a power amplifier to operate efficiently, a smooth and accurate power level ramping between power levels, as well as ramping-up upon powering the PA on and ramping-down upon powering the PA down is desirable. A PA's power control circuit, determines a sequence of power level values the PA is to use when ramping up to the next power level or ramping down from a previous power level. The smoother the ramping sequence used by the PA in operation, the more accurate the PA operation and the less noise and other problems are caused thereby. In most systems, the optimal sequence of power ramping values are predefined and specified for the air interface. These values are stored in a memory device associated with the control circuit of the PA, as described with respect to FIG. 1, below. Sequences for each power level can be stored in the memory device and accessed when required to control the PA. However, even when the memory device of a control circuit is loaded with the most efficient ramp-up and ramp-down values, there still exists a need to improve the resolution of the analog control signals sent to the power amplifiers.

The signal processing normally occurring between the output of the PA power control circuit and the PA includes conversion of the digital value determined in the control section to an analog value and removal of transient signals through the use of a pass filter, which removes the transient signal energy without affecting lower frequencies of the signal being sent to the PA.

Sigma-delta modulation employed within digital-to-analog (D-A) converters is known to have several advantageous effects with respect to digital signals. Initially, sigma-delta techniques tend to provide better resolution than conventional D-A converters which were fabricated using analog components. A sigma-delta modulator also has the effect of moving noise out of the low frequencies of a signal. A further description of the uses and implementation of a sigma delta modulator per se, albeit not in the context of PA control, is discussed in U.S. Pat. No. 5,117,234, incorporated herein by reference.

One drawback of this type of implementation is that a sigma delta modulator is is quite complex. Thus, there is a need for a system that can utilize the advantages provided by a sigma-delta modulated digital-to-analog converter in a PA control circuit but at a reduced cost and complexity level.

SUMMARY

It is therefore an object of the present invention to provide a power amplifier having an improved dynamic power control signal with a higher resolution input into a power amplifier that can be efficiently used by a communication device during transmission of signals.

It is a further object of the present invention to provide a circuit for controlling the power amplifier which addresses the problems associated with noise reduction and cost effectiveness. A further object of the present invention reduces the number of hardware elements required in a control circuit, therefore, allowing for reduction of noise at a reduced cost.

Exemplary embodiments of the invention employ a storage device for controlling the power amplifier. Multiple sequences of data are stored in a storage device for proper ramp-up and ramp down of a power amplifier, which sequences are first processed using a sigma delta modulation technique. Since a sigma delta modulator outputs a predefined digital bit stream, a system can be built in which the discrete sequence of values generated by a sigma delta modulator can be combined with the digital ramp-up and ramp-down sequences to define a set of sigma-delta modulated ramp-up and ramp-down sequences. Storage of these sequences within a storage device in the power control circuit of a power amplifier results in the reduction of costs via a reduction in hardware components used.

BRIEF DESCRIPTION OF THE DRAWINGS

These and other features, objects and advantages associated with the present invention will be more readily understood upon reading the following detailed description, when read in conjunction with the drawings in which like reference numerals refer to like elements and where.

DESCRIPTION

The present invention will now be described with reference to the accompanying drawings, in which various exemplary embodiments of the invention are shown. However, this invention may be embodied in many different forms and should not be construed as limited to the specific embodiments shown.

Figure 1:
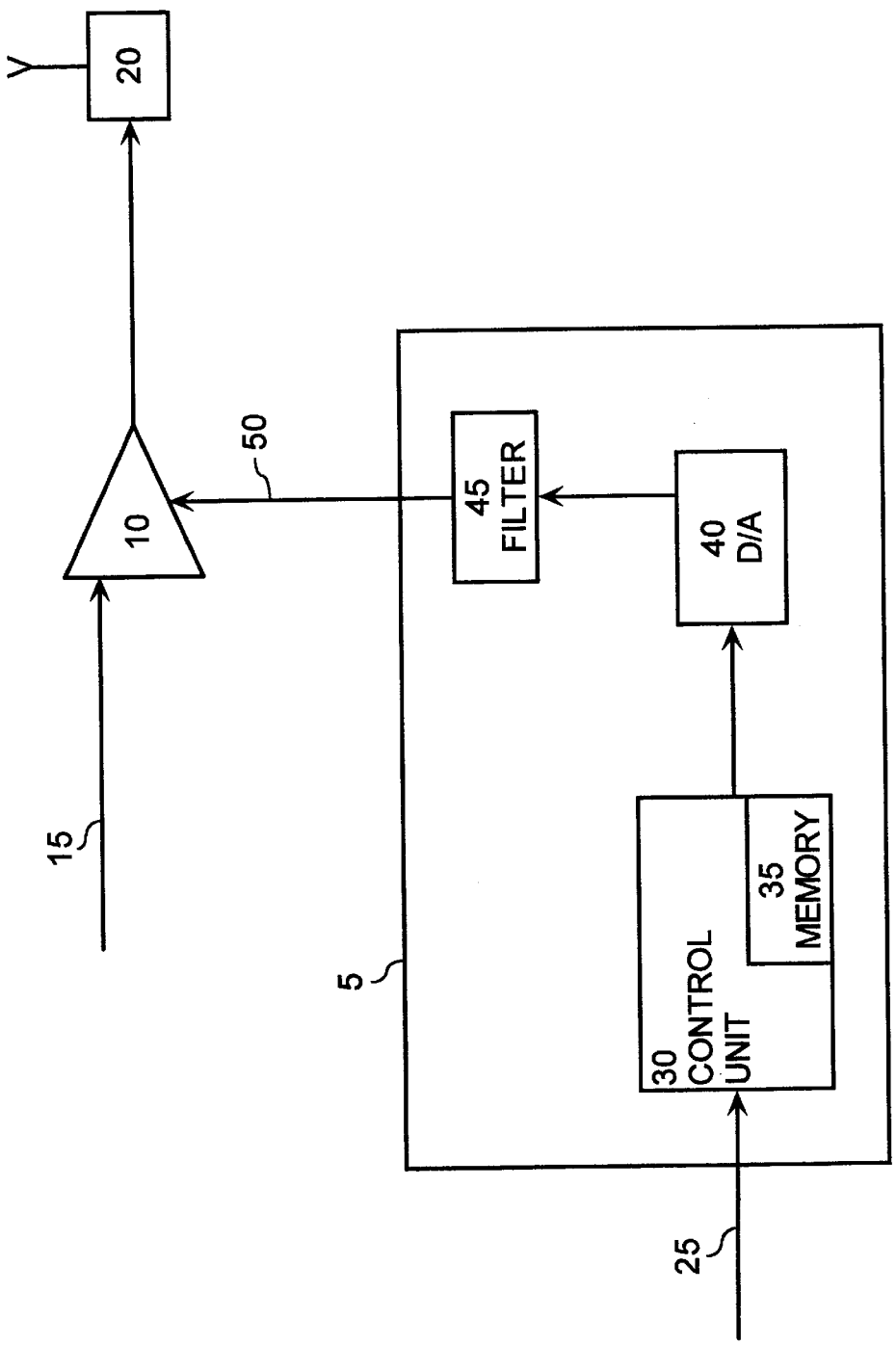
FIG. 1 is a block diagram of a conventional power amplifier circuit.

A block diagram of a typical power amplifier and associated power control section 5 is shown in FIG. 1. The power control section 5 is shown coupled to a control input of a power amplifier (PA) 10. An RF input 15 to power amplifier 10 provides an RF signal that is amplified to a predetermined power level based on the value provided to the PA at the control input. The amplified signal is then coupled to an antenna 20 and transmitted to a receiver (not shown).

The power control section 5 determines the specific power level control sequences 50 to be sent to the power amplifier 10. An addressable memory device 35, such as an addressable ROM or RAM, is used to store a plurality of ramp-up and ramp-down sequences to be applied to the PA 10 at different times. These sequences are typically predefined by an air interference standard. For example, certain GSM transmitters may have 16 different power levels. As such, there can be, for example, 16 different ramp-up sequences and 16 different ramp-down sequences stored in the memory device 35. Thus, when the power control section 5 receives a control input 25 at a control unit 30, the control unit 30 retrieves a sequence of ramp-up and ramp-down values from the memory device 35 based upon the control input 25. The power control sequences 50 representing the ramp-up and ramp-down values are sent to a digital-to-analog converter 40 where the sequences are converted to analog signals. The analog signals are then smoothed by a filter 45 before being sent to control the PA 10.

It is apparent that efficient digital-to-analog data conversions are required for efficient power amplifier operation. In an effort to gain higher signal resolution when converting from digital to analog signals, sigma-delta digital-to-analog converters have been employed which utilize a sigma-delta modulator placed within a digital-to-analog converter. A delta-sigma modulator essentially requantizes the digital signal so that any requantization error is distributed at a higher frequency to "noise-shape" the signal. The sigma delta operates to convert a multi-bit digital signal to a reduced multi-bit digital signal.

Figure 2:
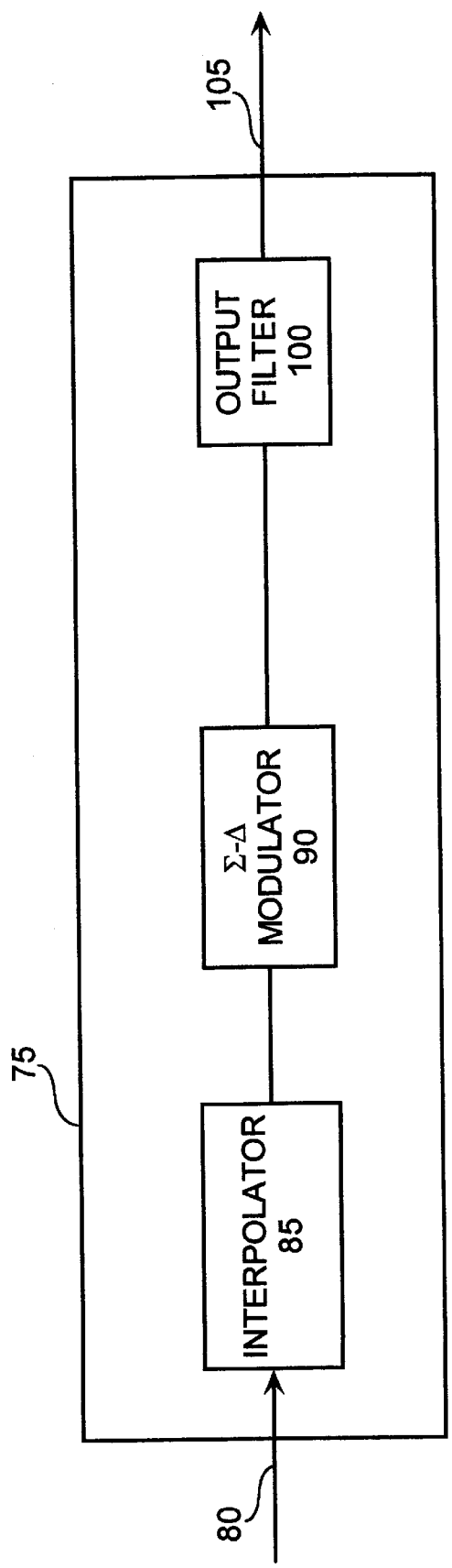
FIG. 2 is a block diagram of a sigma-delta digital-to-analog converter.

A typical sigma-delta digital-to-analog converter 75 is shown in FIG. 2. Within the converter, a digital signal 80 is input into a interpolator 85 which, oversamples (i.e., increases the sampling rate) the digital input signal. Oversampled digital signal output from the interpolator 85 is sent to a sigma-delta modulator 90. The operation of the sigma-delta modulator 90, as discussed above, is to noise-shape the overmodulated signal. Noise located in the lower frequencies is shifted to the higher frequencies. Since the output of the sigma-delta modulator 90 is still in a digital format, the output is sent to an output smoothing filter 100 which smooths the signals and outputs an analog signal 105.

Figure 3:
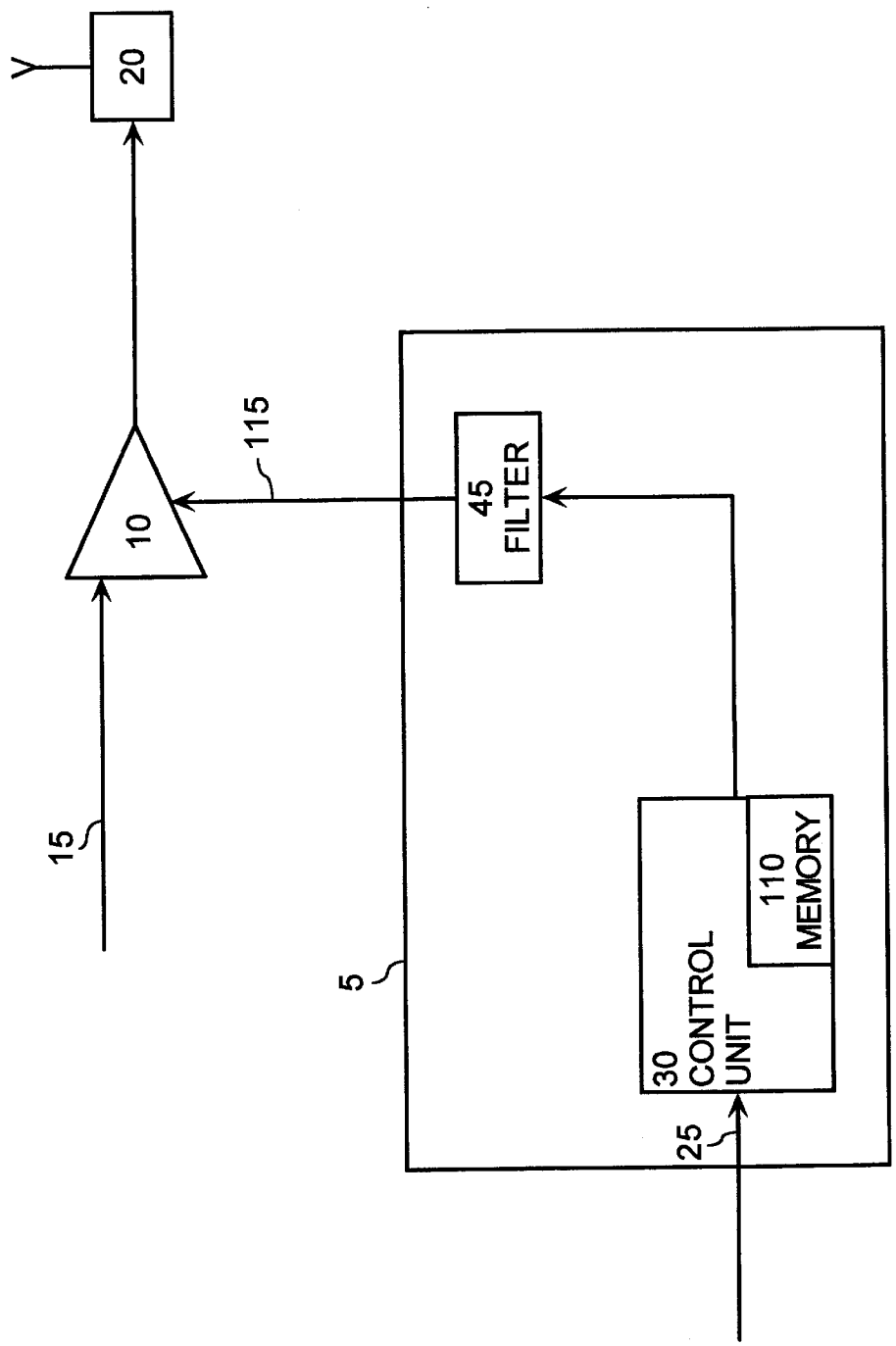
FIG. 3 is a block diagram of the power amplifier circuit in accordance with an exemplary embodiment of the present invention.

As recognized by Applicants, and because a sigma-delta modulator outputs digital data streams that are known and repetitive, the digital-to-analog converter 40 can be eliminated from the power amplifier 40. In fact, as long as there is enough memory, ramp-up and ramp-down values associated with the power amplifier can first be sigma-delta modulated and then stored as a set of sigma-delta modulated ramp-up and ramp-down sequences in a memory device. In order to provide an accurate higher resolution power control signal to a power amplifier, the present invention provides the storage and retrieval of sigma-delta modulated ramp-up and ramp-down sequences as illustrated in the block diagram of FIG. 3.

Therein, the power control section 5 is shown coupled to a control input of a power amplifier 10. An RF input 15 to power amplifier 10 is amplified to a predetermined power level then transmitted by transmitter 20 as discussed above with respect to FIG. 1. The power control section 5 determines the power level and proper power sequence at which the power amplifier 10 is to amplify the RF signal 15. A memory device 110 (e.g., an addressable ROM or RAM) is utilized to store sigma-delta modulated ramp-up and ramp-down sequences to be applied to the PA based upon the power level required by the system. While a memory device is described as a ROM or RAM above, one skilled in the art would recognize that any suitable addressable memory device could be used to store the required power control sequences.

The specific ramp-up and ramp-down sequences to be applied by the power control section 5 are known and determined by the basic transmission requirements such as the air interface specification and type of system being utilized. Thus, the power control section 5, in response to the control signal 25, retrieves the required sigma-delta modulated ramp-up and ramp-down values from the memory device 110. The power level control sequence 115 data representing the sigma-delta modulated ramp-up and ramp-down values is sent to a filter 45 before being sent to control the PA 10. The function of the filter 45 (e.g., a low-pass filter) is to convert the digital sequence output from the control unit 30 to analog values which are required by the control input to the power amplifier 10.

Figure 4:
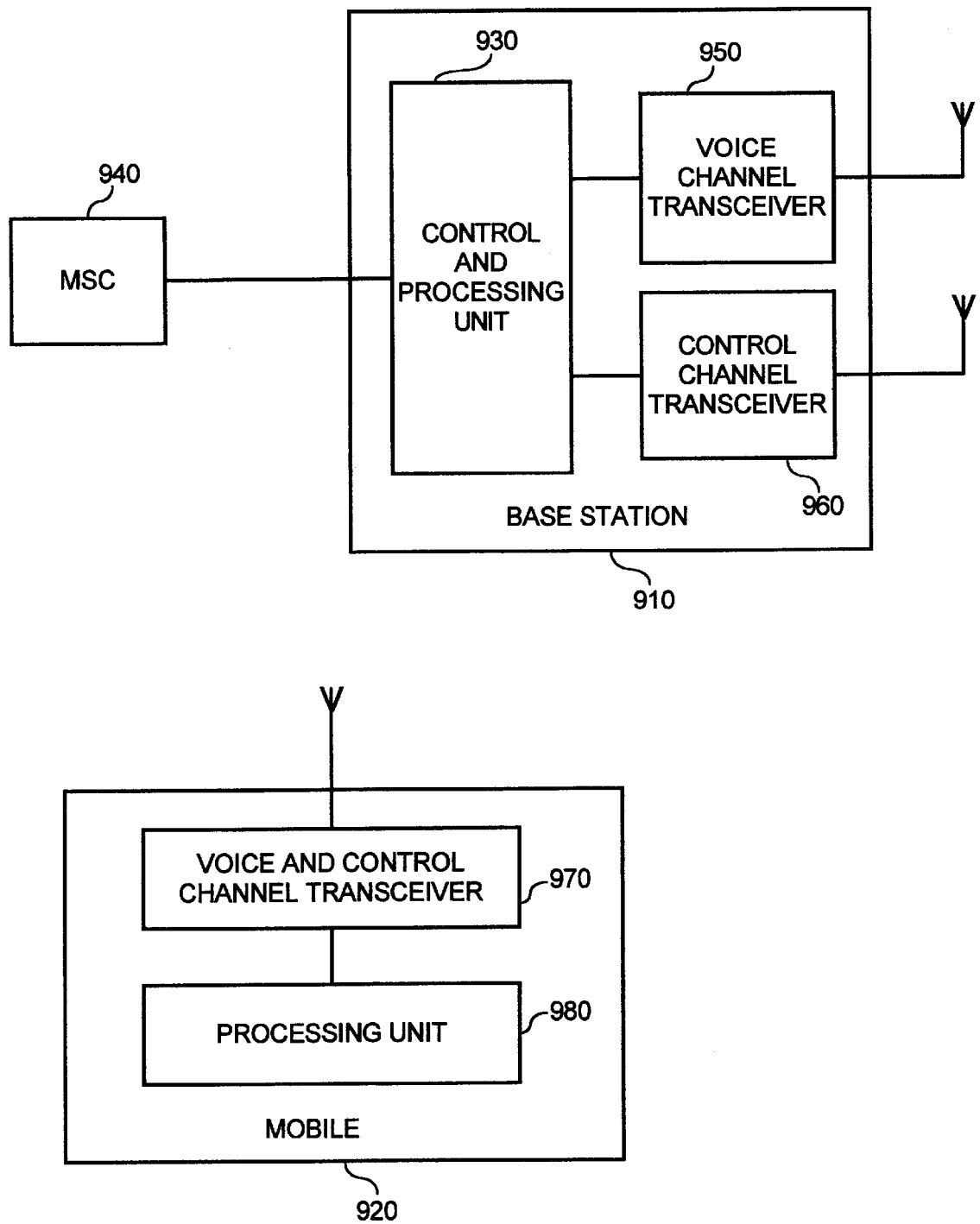
FIG. 4 is a block diagram of a cellular mobile radiotelephone system in accordance with an exemplary embodiment of the present invention.

As mentioned earlier, PAs according to the present invention may be used in, for example, cellular telephone units. These devices can be used to transmit messages at different power levels used to support communications between mobile and base stations in radio communication systems. FIG. 4 represents a block diagram of an exemplary cellular mobile radio telephone system according to one embodiment of the present invention in which PAs described above can be used to generate RF signals for data transmission. The system shows an exemplary base station 910 and a mobile 920. The base station includes a control and processing unit 930 which is connected to the MSC 940 which in turn is connected to the public switched telephone network (not shown).

The base station 910 for a cell includes a plurality of voice channels handled by voice channel transceiver 950 which is controlled by the control and processing unit 930. Also, each base station includes a control channel transceiver 960 which may be capable of handling more than one control channel. The control channel transceiver 960 is controlled by the control and processing unit 930. The control channel transceiver 960 broadcasts control information over the control channel of the base station or cell to mobiles locked to that control channel. The voice channel transceiver handles the traffic or voice channels which can include digital control channel location information as described previously.

When the mobile 920 first enters the idle mode, it periodically scans the control channels of base stations like base station 910 to determine which cell to lock on or camp to. The mobile 920 receives the absolute and relative information broadcasted on a control channel at its voice and control channel transceiver 970. Then, the processing unit 980 evaluates the received control channel information which includes the characteristics of the candidate cells and determines which cell the mobile should lock to. The received control channel information not only includes absolute information concerning the cell with which it is associated, but also contains relative information concerning other cells proximate to the cell with which the control channel is associated. These adjacent cells are periodically scanned while monitoring the primary control channel to determine if there is a more suitable candidate. Additional information relating to specifics of mobile and base station implementations can be found in U.S. patent application Ser. No. 07/967,027 entitled "Multi-Mode Signal Processing" filed on Oct. 27, 1992 to P. Dent and B. Ekelund, which disclosure is incorporated by reference.

Although the foregoing exemplary embodiment has been described in terms of base and mobile stations, the present invention can be applied to any radiocommunication system. For example, satellites could transmit and receive data in communication with remote devices, including portable units, PCS devices, personal digital assistants, etc.

While the present invention has been described with respect to its preferred embodiment, those skilled in the art will recognize that the present invention not limited to the specific embodiment described and illustrated herein. For example, although sigma delta modulation is described above in conjunction with an embodiment of the present invention, other conversion techniques could be used where the generated bit pattern is repetitive in nature and where enough storage is available for the controlling sequence.

Different embodiments and adaptations besides those shown herein and described as well as many variations, modifications and equivalent arrangements will now be apparent or will be reasonably suggested by the foregoing specification and drawings without departing from the substance of the scope of the invention.

What is claimed is:

1. A power amplifier circuit comprising:
   a power amplifier controlled by an analog signal;
   a memory device for storing a sequence of sigma delta modulated ramp-up and ramp-down values used to control amplification of said power amplifier; and
   a power control circuit for retrieving said sequence of sigmna delta modulated ramp-up and ramp-down values from said memory device, which sequence is supplied to said power amplifier to vary an amplification of said power amplifier.

2. The power amplifier circuit of claim 1, wherein said power control circuit further comprises a smoothing filter for smoothing said sequence of sigma delta modulated ramp-up and ramp-down values supplied directly from the memory device and outputting an analog value.

3. The power amplifier circuit of claim 2, wherein said smoothing filter is a low-pass filter.

4. The power amplifier circuit of claim 2, wherein said analog value is supplied directly from said smoothing filter to said power amplifier.

5. A circuit comprising:
   a power amplifier having a data input and control input for amplifying a signal provided on said data input based on a value received on said control input;
   a memory device for storing power control commands;
   a control circuit for addressing said memory device to output selected power control commands to said control input; and
   a filter disposed between said memory device and said control input, wherein said filter is connected directly to said control circuit and directly to said power amplifier.

6. The circuit of claim 5, wherein said filter is a low pass filter.

7. The circuit of claim 5, wherein said power control commands are sigma-delta modulated sequences.

8. The circuit of claim 7, wherein said sigma delta modulated sequences are ramp-up and ramp-down power control values.

9. A method of operating a power amplifier circuit, comprising:
   storing power control commands in a memory, wherein said power control commands comprise sigma delta modulated ramp-up and ramp-down sequences for controlling the power amplifier circuit;
   addressing said memory to output selected power control commands upon command;
   filtering said selected power control commands;
   sending said filtered selected power control commands to said power amplifier circuit; and
   operating said power amplifier circuit based upon said filtered selected power control commands.

10. A communications device, comprising:
    a transmitter for transmitting an outgoing signal;
    said transmitter further comprising:
      a power amplifier to amplify said outgoing signal before transmission;
      a memory device for storing a sequence of sigma delta modulated ramp-up and ramp-down values used to control amplification of said power amplifier; and a receiver for receiving an incoming signal.

11. The communications device of claim 10, wherein said transmitter further comprises:

a power control circuit for retrieving said sigma delta modulated ramp-up and ramp-down values from said memory device and supplying said sigma delta modulated ramp-up and ramp-down values to said power amplifier to vary an amplification of said power amplifier.

12. The communications device of claim 11, wherein said power control circuit further comprises a smoothing filter for smoothing said sigma delta modulated ramp-up and ramp-down values supplied directly from the memory device and outputting an analog value.

13. The communications device of claim 12, wherein said smoothing filter is a low-pass filter.

14. The communications device of claim 12, wherein said analog value is supplied directly from said smoothing filter to said power amplifier.

* * * * *